(12) United States Patent
Kobayashi

(10) Patent No.: US 6,480,314 B1
(45) Date of Patent: Nov. 12, 2002

(54) OPTICAL TRANSMITTER

(75) Inventor: Ippei Kobayashi, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/300,828

(22) Filed: Apr. 27, 1999

(30) Foreign Application Priority Data

Apr. 27, 1998 (JP) .......................................... 10-131014

(51) Int. Cl.[7] .............................................. H04B 10/04
(52) U.S. Cl. ...................................... 359/187; 359/161
(58) Field of Search .............................. 359/187, 194, 359/180, 161

(56) References Cited

U.S. PATENT DOCUMENTS

| | | | | |
|---|---|---|---|---|
| 5,448,629 A | * | 9/1995 | Bosch et al. ................. | 359/187 |
| 6,108,114 A | * | 8/2000 | Gilliland et al. ............ | 359/187 |

FOREIGN PATENT DOCUMENTS

| | | |
|---|---|---|
| JP | 54-63603 | 5/1979 |
| JP | 61-224385 | 10/1986 |
| JP | 1-135085 | 5/1989 |
| JP | 2-129983 | 5/1990 |
| JP | 3-145171 | 6/1991 |
| JP | 5-75547 | 3/1993 |
| JP | 6-164497 | 6/1994 |
| JP | 7-193540 | 7/1995 |
| JP | 7-273388 | 10/1995 |
| JP | 8-279788 | 10/1996 |
| JP | 9-83442 | 3/1997 |
| JP | 9-200153 | 7/1997 |

OTHER PUBLICATIONS

Japanese Office Action issued Aug. 15, 2000 in a related application with English translation of relevant portions.

* cited by examiner

Primary Examiner—Leslie Pascal
Assistant Examiner—Christina Y. Leung
(74) Attorney, Agent, or Firm—Dickstein, Shapiro, Morin & Oshinsky, L.L.P.

(57) ABSTRACT

Part of output light of an LD 11 issuing a signal light 10 depending on a driving current is received by a photo diode 13, and the current corresponding to the reception power is converted into a voltage in a current-voltage converting circuit 14, and an average voltage V1 is detected in an average voltage detecting circuit 15. The average voltage V1 and a reference voltage V2 depending on a mark rate issued from a reference voltage control circuit 16 are entered in an optical output control circuit 17, and the driving current to be supplied into the LD 11 is controlled by a laser driving circuit 19 through a driving current control circuit 18 so that the LD 11 may not pass any current exceeding a preset value. At the time of response by optical output cut-off or its cancellation, by controlling the average voltage V1 and reference voltage V2 by the excessive output preventive circuit 41, generation of excessive optical output is prevented. As a result, an automatic power control circuit of the optical transmitter can emit an output light within the standard from the laser diode even at the time of transient response by optical output cut-off or cancellation of optical output cut-off.

11 Claims, 15 Drawing Sheets

FIG.5
(PRIOR ART)
(a) OUTPUT OF OPTICAL OUTPUT CUT-OFF PROCESSING CIRCUIT 22
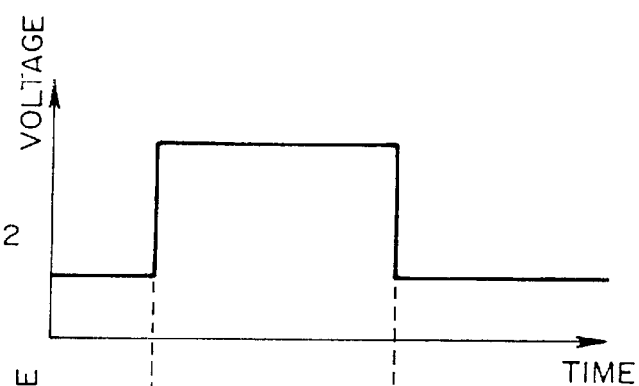
(b) INPUTS V1, V2 OF OPTICAL OUTPUT CONTROL CIRCUIT 17
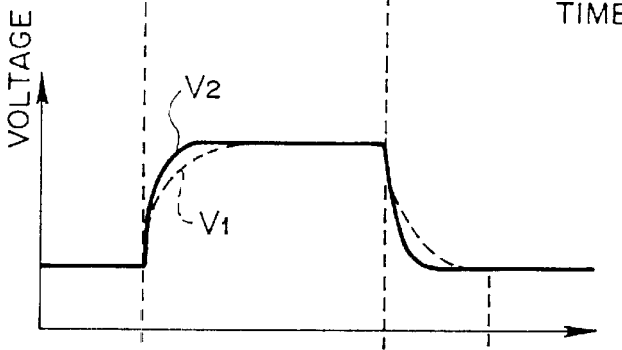
(c) OPTICAL OUTPUT
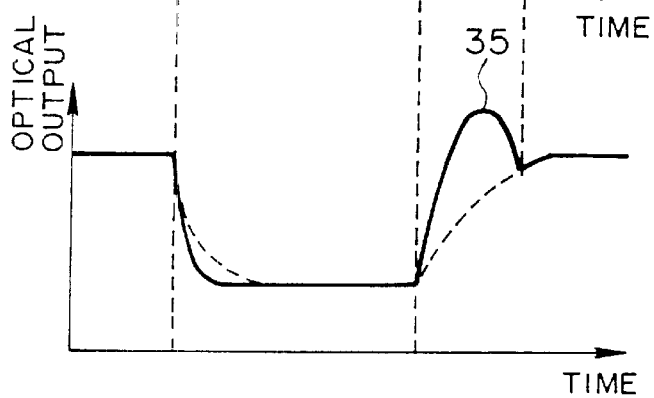

FIG. 6
(PRIOR ART)
(a) OUTPUT OF OPTICAL OUTPUT CUT-OFF PROCESSING CIRCUIT 22
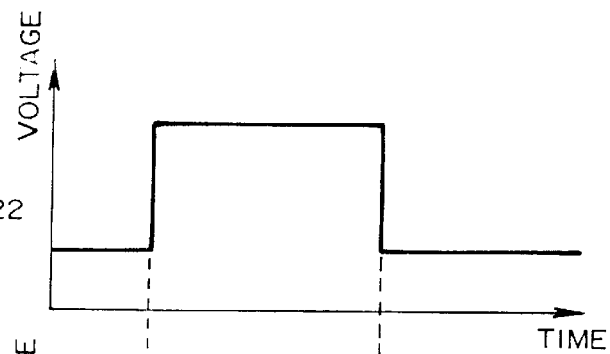
(b) INPUTS V1, V2 OF OPTICAL OUTPUT CONTROL CIRCUIT 17
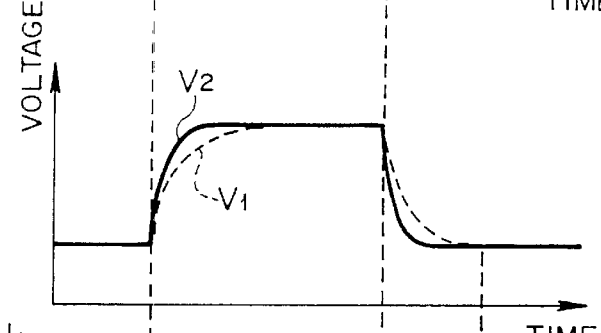
(c) OPTICAL OUTPUT
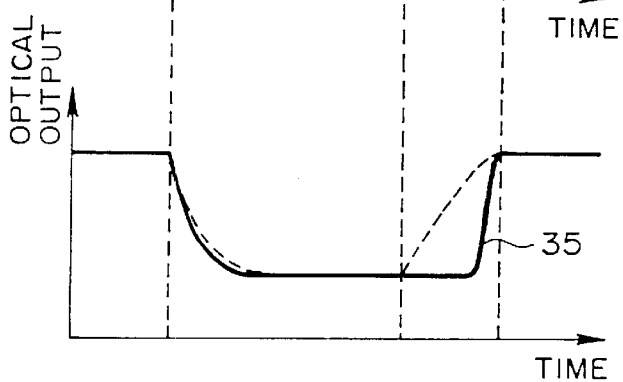

OPTICAL TRANSMITTER

BACKGROUND OF THE INVENTION

1. Field of the Invention

The present invention relates to an optical transmitter having a laser diode and capable of controlling its driving current by an automatic power control (automatic power control: APC hererinafter) circuit, and more particularly to an optical transmitter capable of controlling the optical output in transient response at the time of optical output cut-off or cancellation of optical output cut-off.

2. Prior Art

An optical transmitter includes a laser diode (light amplification by stimulated emission of radiation diode: LD hereinafter), and by controlling its driving current, a signal corresponding to transmission information is set to an optical receiver. However, since the LD changes in its characteristics depending on temperature changes or aging effects, if the same driving current is supplied, the output optical power from the LD fluctuates. As a result, the transmission output power may decrease to deteriorate the S/N (signal to noise) ratio, or the LD or the optical receiving element at the transmission destination may be broken by an excessive driving current. In the conventional optical transmitter, accordingly, to enhance its reliability, by using APC circuit and driving current control circuit, it is attempted to compensate for fluctuations of characteristics due to temperature changes or aging effects of LD and limit excessive driving current.

The APC circuit receives part of the LD output or back light by a photo diode, feeds back its reception power to control the driving current of the LD, so that a desired optical power is constantly delivered from the LD. The driving current control circuit controls the driving current supplied to the LD so as not to exceeds a limit value predetermined according to the LD standard.

FIG. 1 shows an outline of such conventionally proposed constitution of an optical transmitter. This optical transmitter comprises an LD 11 for delivering a signal light 10 depending on a driving current, and a photo diode 13 for receiving part of output light of the LD 11 or back light 12. The optical transmitter further comprises a current-voltage converting circuit 14 for converting a received current generated by receiving part of the output light from the LD 11 or back light 12 by the photo diode 13 into a voltage value, an average detecting circuit 15 for detecting the average of voltage values converted by the current-voltage converting circuit 14, and a reference current control circuit 16 for detecting the mark rate which is the appearance ratio of "1" state and "0" state of transmission data, and issuing a corresponding voltage value, in which an average voltage V1 detected by the average detecting circuit 15 and a reference voltage V2 detected by the reference voltage control circuit 16 depending on the mark rate of transmission rate are entered into an optical output control circuit 17.

The optical output control circuit 17 issues a control signal so that the entered average voltage V1 and reference voltage V2 may be equal to each other, and its output is entered into a driving current control circuit 18. The driving current control circuit 18 can control a laser driving circuit 19 for generating a driving current of the LD 11 as disclosed in, for example, Japanese Laid-open Patent No. 7-193540, and by controlling so that the laser driving circuit 19 may not pass any current exceeding the preset value of the LD 11, the LD 11 is prevented from generating an excessive optical output. The output of the driving current control circuit 18 which is controlled thus by the optical output control circuit 17 is entered in the laser driving circuit 19, and the driving current of the LD 11 can be controlled, so that the average voltage value detected by the average detecting circuit 15 by changing the optical power of the optical signal can be controlled.

That is, the optical output control circuit 17 can raise the average voltage by controlling the driving current control circuit 18 and laser driving circuit 19 so that the power of the output light from the LD 11 may be larger when the entered average voltage V1 is smaller than the reference voltage V2, and thereby the difference between the average voltage V1 and reference voltage V2 can be decreased. On the other hand, when the entered average voltage V1 is larger than the reference voltage V2, by controlling the driving current control circuit 18 and the laser driving circuit 19 so that the power of the output light from the LD 11 may be smaller, the average voltage is lowered, and the difference between the average voltage V1 and reference voltage V2 can be decreased. In this way, the optical output control circuit 17 issues a control signal corresponding to the difference between the average voltage V1 and reference voltage V2 to the driving current control circuit 18 in order to obtain a desired output light from the LD 11. As a result, the optical output power of the LD 11 is maintained at a constant optical output depending on the reference voltage V2 of the reference voltage control circuit 16.

In such optical transmitter, it is possible to change the driving current by the laser driving circuit 19 so as to compensate for threshold current due to, for example, temperature changes of the LD 11 or fluctuations of the output power of the LD 11 due to variation of slope efficiency. Or, against characteristic changes due to aging effects of the LD 11, the driving current can be changed so as to compensate for the variation, so that the output power of the LD 11 may be maintained constant.

By the way, the optical transmitter includes an optical output cut-off processing circuit 22 for controlling the laser driving circuit 19 for cutting off the optical output by an optical output forced cut-off input 20 from outside and a detection signal 21 of the preset condition of optical output cut-off. Accordingly, the optical output during optical output constant control can be cut off. Depending on the preset condition of optical output cut-off, herein, the optical output cut-off may be detected when the aforesaid mark rate is lower than the specified value, for example, due to cut-off the transmission data or clock. Thus, when the optical output cut-off is recognized by the optical output forced cut-off input 20 or optical output cut-off condition detection signal 21, the optical output cut-off processing circuit 22 controls the laser driving circuit 19, and cuts off the optical output from the LD 11. On the other hand, when the optical output forced cut-off input 20 or optical output cut-off condition detection signal 21 is canceled, the optical output cut-off control of the laser driving circuit 19 is canceled, so that an optical signal controlled at a constant optical output can be issued.

The technology relating to such optical transmitter is disclosed, for example, in Japanese Laid-open Patent No. 7-193540 and Japanese Laid-open Patent No. 5-075547.

Japanese Laid-open Patent No. 7-193540 discloses an optical transmitter for communication for transmitting video by controlling the optical output constant by an optical automatic output control (auto power control) circuit, and using a semiconductor laser diode controlled so that the driving current may not exceed a specific value by using a limiter circuit, in which for the safety of the operator in case of emergency, the circuit for output shut-down of the semiconductor laser diode is realized simply by using a limiter circuit.

Japanese Laid-open Patent No. 5-075547 discloses an optical transmitter comprising a semiconductor laser, a semiconductor laser driving circuit for feeding a semiconductor laser driving current composed of a light modulation signal current for modulating the intensity of exit light of the semiconductor laser by an input signal and a direct-current bias signal into the semiconductor laser, a mark rate detecting circuit for detecting the integral value of pulse component of input signal, and a shut-off circuit for turning on or off the supply of the semiconductor laser driving current. According to a function provided in the optical transmitter, the input signal is branched into two, one is put into the semiconductor laser driving circuit, and other is put into the mark rate detecting circuit, and when the output of the mark rate detecting circuit becomes smaller than a real number specified value A or larger than real number specified value B satisfying the relation of A<B, the shut-off circuit is operated, and emission of the semiconductor laser is prohibited. The optical transmitter disclosed in these publications is basically same as shown in FIG. 1.

However, including the optical transmitters disclosed in these publications, the conventional optical transmitter shown in FIG. 1 is known to have a problem of generation of optical output power exceeding the standard of the LD 11 in transient response at the time of optical output cut-off or cancellation of optical output cut-off by the optical output forced cut-off input 20 or optical output cut-off condition detection signal 21. The conventional optical transmitter has the driving current control circuit 18, and prevents flow of excessive driving current into the LD 11, but it cannot prevent excessive output of the LD 11 at the time of transient response.

FIG. 2 shows an outline of the relation between driving current and optical output from the LD. In the LD, as shown herein, the optical output increases, depending on the operating temperature, after a certain driving current value. In the optical transmitter using the LD, it is required to set the driving current value so that a desired optical output may be obtained from the LD whether the operating temperature is high or low. For example, supposing that the driving current limit value is set at I0, the LD output power at low temperature is appropriate, but the LD output at high temperature is limited, and a desired set output power cannot be obtained. On the other hand, supposing that the driving current limit value is set at I1, the LD output power at high temperature is appropriate, but the LD output at low temperature generates a high optical output exceeding the optical output standard of the LD. Usually, the driving current limit set value Is is set so that a desired optical output may be obtained even if the LD is at high temperature.

By contrast, composing a reference by using parts having temperature characteristics, in other method, it may be considered to change the driving current limit value by referring to the reference changing similarly depending on the operating temperature. It, however, requires adjustment depending on the characteristics of individual LDs, and a same adjustment is needed for the driving current value for preventing the excessive output at the time of transient response, which results in a higher cost.

A further detail is described below about generation of excessive output at the time of transient response in such optical transmitter having the driving current limit set at Is. As known as a cause of generation of excessive output at the time of transient response by the optical transmitter, the output average voltage V1 from the average detecting circuit 15, the output reference voltage V2 from the reference voltage control circuit 16, and the output from the driving current control circuit 18 have individually different time constants, and each time constant varies in transient response due to optical output cut-off or its cancellation.

FIG. 3 shows the operation of transient response at the time of cancellation of optical output cut-off in the optical transmitter shown in FIG. 1 for explaining such problem. Suppose, hereinafter, that the average voltage V1 changes at rise time tr1 and fall time tf1 by the time constant of the average detecting circuit 15, and that the reference voltage V2 changes at rise time tr2 and fall time tf2 by the time constant of the reference voltage control circuit 16. Also suppose that the control of optical output cut-off is started at time T0 by the optical output forced cut-off input 20 or optical output cut-off condition detection signal 21, and that the control of the optical output cut-off is canceled at time T1 (FIG. 3(a) 23).

When the control of optical output cut-off is started at time T0, since the average detecting circuit 15 and reference voltage control circuit 16 individually have the time constant depending on their load or operating conditions, the average voltage V1 and reference voltage V2 cannot be changed at the same timing as the timing of optical output cut-off. The average voltage V1 delivered from the average detecting circuit 15 by way of the photo diode 13 and voltage-current converting circuit 14 changes at the timing of rise time tr1 or fall time tf1 as shown in FIG. 3(b) by its intrinsic time constant (FIG. 3(b) 24). Herein, the reference voltage V2 delivered from the reference voltage control circuit 16 is directly a voltage depending on the mark rate of the detected transmission data regardless of the optical output cut-off (FIG.3 (b) 25).

The optical output control circuit 17 controls the driving current of the LD 11 so that the average voltage V1 and reference voltage V2 may be equal to each other as far as the average detection circuit 15 is an ideal circuit not having time constant, and therefore can control the cancellation of optical output cut-off nearly at the same timing depending on the cancellation of the optical output cut-off input 23 (FIG. 3(c) 26). However, since the average voltage V1 changes by a time constant, the optical output control circuit 17 produces an output so that V1 and V2 may be equal to each other, so as to, for example, raise the optical output (FIG. 3(c) 27).

The optical output control circuit 17 can cancel the output of the driving current control circuit 18 at the same timing as when canceling the optical output cut-off input 23 as far as the average detection circuit 15 is an ideal circuit not having time constant (FIG. 3(d) 28). However, since it always has a certain time constant, it cannot control the optical output cut-off by lowering the driving current nearly at the same timing as the optical output cut-off input 23. Accordingly, the driving current control circuit 18 operates to deliver a driving current depending on the output of the optical output control circuit 17 shown in FIG. 3(c) to the laser driving circuit 19 (FIG. 3(d) 29). In the laser driving circuit 19, therefore, although the driving current to be fed into the LD 11 does not reach the driving current limit set value Is shown in FIG. 2 (FIG. 3(d) 30), a driving current exceeding the maximum rated output 31 of the LD 11 is to be fed, and the driving current is controlled so as to coincide with the predetermined driving current limit set value Is.

That is, as shown in FIG. 2, although it is within the optical output limit 30 by the driving current control circuit 8 determined as the driving current limit set value Is being intrinsic to the LD, an excessive output light exceeding the LD maximum rated output value 31 is generated. Moreover, when canceling the optical output cut-off, as shown in FIG. 3(d), the laser driving circuit 19 is controlled so as to supplying a driving current exceeding the maximum rated output.

Thus, the optical power issued from the LD 11 can be generated an optical output power within the standard generated by the output 28 of the driving current control circuit 18 in an ideal environment not having time constant (FIG. 3(e) 32). However, by having the time constants, when the optical output control circuit 17 controls to raise the optical output, the LD 11 generates an optical output power exceeds the standard (FIG. 3(e) 33).

Next is explained the relation between the average voltage V1 and reference voltage V2 to be entered in the optical output control circuit 17 at the time of transient response in optical output cut-off or cancellation of optical output cut-off.

FIG. 4 shows the transient response changes of optical output in the case of change of V1 and V2 by the same value as the average detecting circuit 15 and reference voltage control circuit 16 change by the same time constant. The output of the current-voltage converting circuit 14 converts the monitored current into a voltage by the resistance. In FIG. 4, a resistance is connected to the supply voltage as a method of converting from current into voltage, and the output voltage of the circuit is a supply voltage at the time of optical output cut-off, and a voltage lower than the supply voltage by the portion of voltage drop due to resistance at the time of optical output. In this way, when the optical output cut-off is started at time T0 and the optical output cut-off is canceled at time T1, the optical output of the LD 11 driven by the laser driving circuit 19 gradually stops at a certain time constant as the average voltage V1 and reference voltage V2 change at the same timing, and the normal voltage is restored gradually at the time of cancellation of optical output cut-off.

FIG. 5 shows transient response changes of optical output when the average voltage V1 is larger than the reference voltage V2 due to change at different time constants. As show in FIG. 5(a), when the optical output cut-off is started at time T0 and the optical output cut-off is canceled at time T1, the average voltage V1 and reference voltage V2 are entered in the optical output control circuit 17 as shown in FIG. 5(b). As a result, a state of average voltage V1>reference voltage V2 occurs at the time of transient response by cancellation of optical output cut-off, and generation of such excessive optical output may not be suppressed (FIG. 5(c) 35). Herein, in the case of average voltage V1>reference voltage V2, since the monitor current is smaller than a desired output (the average voltage V1 is a voltage due to voltage drop by the resistance connected to the power source, and hence when the average voltage V1 is high, the motor current is small), the optical output control circuit 17 judges that the optical output is lowered, and hence controls to raise the optical output.

FIG. 6 shows transient response when the average voltage V1 is not larger than the reference voltage V2 due to change at different time constants. As shown in FIG. 6(a), when the optical output cut-off is started at time T0 and the optical output cut-off is canceled at time T1, the average voltage V1 and reference voltage V2 are entered in the optical output control circuit 17 as shown in FIG. 6(b). As a result, since the state of average voltage V1<reference voltage V2 is maintained also at the time of transient response due to cancellation of optical output cut-off, if the output of the average detecting circuit 15 is lower than the reference voltage V2 which is one of the inputs to the optical output control circuit 17 (that is, the monitor current is larger), it is judged that an output larger than a desired output is produced, so that excessive optical output is not generated (FIG. 6(c) 35).

As mentioned herein, as the output of the reference voltage control circuit 16 of the optical output control circuit 17, the output of the average detecting circuit 15, and the driving current control circuit 18 change by different time constants by the input of optical output cut-off, the LD may produce a problem that an output exceeds the standard optical power at the time of transient response. As a result, the LD or the receiving side element is broken or deteriorates, and the reliability is extremely lowered. However, by keeping the relation of average voltage V1<reference voltage V2 between the average voltage V1 and reference voltage V2 entered in the optical output control circuit 17 all the time, generation of excessive optical output can be suppressed at the time of transient response. Usually, since these time constants depend on the constituent parts, it is hard to adjust in the manufacturing stage.

On the other hand, in the technology relating to the optical transmitter disclosed in Japanese Laid-open Patent No. 7-193540 or Japanese Laid-open Patent No. 5-075547, nothing is considered about excessive output at the time of transient response by optical output cut-off or its cancellation, such problems are inevitable.

SUMMARY OF THE INVENTION

It is an object of the invention to present an optical transmitter having an APC circuit capable of detecting the output light within the standard from the LD even at the time of transient response due to optical output cut-off or cancellation of optical output cut-off.

The invention relates to an optical transmitter which comprises (a) optical transmitting unit for issuing a signal light, (b) optical receiving unit for receiving part of the output light from the optical transmitting unit, (c) transmission level detector for detecting a transmission level depending on the reception power by the optical receiving unit, (d) reference level generator for generating a reference level on the basis of a mark rate of transmission data, (e) driving current changing unit for changing the driving current so that the transmission level detected by the transmission level detector may be equal to the reference level generated by the reference level generator, (f) driving current feed unit for changing the output power of signal light issued from the optical transmitting unit by feeding the driving current changed by the driving current changing unit into the optical transmitting unit, and (g) time constant compensating unit for stopping feed of driving current into the optical transmitting unit by the driving current feed unit only at the time of optical output cut-off, compensating individual different time constants at the time of change of the transmission level and reference level in transient response by optical output cut-off or its cancellation by changing the transmission level and reference level.

That is, the power of the signal light issued from the optical transmitting unit is adjusted by feeding the changed driving current into the optical transmitting unit so that the transmission level detected by the transmission level detector depending on the reception power in part of the signal light issued by the optical transmitting unit may be equal to the reference level generated by the reference level generator on the basis of the mark rate of the transmission data. When the optical output is cut off, feed of driving current into the optical transmitting unit is stopped, and the transmission level and reference level are changed by the time constant compensating unit at the time of transient response by optical output cut-off or its cancellation, thereby compensating for the difference in change of the transmission level and reference level having mutually different time constants at the time of transient response by optical output cut-off or its cancellation.

According to this embodiment of the invention, when the optical output is cut off, feed of driving current into the optical transmitting unit is stopped, and the transmission level and reference level are changed by the time constant compensating unit at the time of transient response by optical output cut-off or its cancellation, thereby compensating for the differences in change of the transmission level and reference level having mutually different time constants at the time of transient response by optical output cut-off or its cancellation. It is therefore possible to prevent generation of excessive optical output conventionally experienced at the time of transient response by optical output cut-off or its cancellation.

The invention further relates to an optical transmitter in which the time constant compensating unit includes delay unit for stopping feed of driving current into the optical transmitting unit by the driving current feed unit only at the time of optical output cut-off, and delaying by the duration of a first time longer than the transient response time by optical output cut-off or its cancellation, and compensates individual different time constants at the time of change of the transmission level and reference level in transient response by optical output cut-off or its cancellation, for the duration of the first time after optical output cut-off or its cancellation, by changing the transmission level and reference level.

That is, when the optical output is cut off, feed of driving current is stopped, and the transmission level and reference level are changed by the time constant compensating unit by the duration of the first time longer than the transient response time after the optical output cut-off or its cancellation, thereby compensating for the difference in change of the transmission level and reference level having mutually different time constants at the time of transient response by optical output cut-off or its cancellation.

According to this embodiment of the invention, when the optical output is cut off, feed of driving current is stopped, and the transmission level and reference level are changed by the time constant compensation unit by the duration of the first time longer than the transient response time after the optical output cut-off or its cancellation, thereby compensating for the difference in change of the transmission level and reference level having mutually different time constants at the time of transient response by optical output cut-off or its cancellation. It is therefore possible to change the transmission level and reference level only by adding a simple delay circuit to the conventional optical transmitter having the APC circuit, and prevent generation of excessive optical output conventionally experienced at the time of transient response by optical output cut-off or its cancellation.

The invention also relates to an optical transmitter in which the time constant compensating unit stops feed of driving current into the optical transmitting in which the time constant compensating unit stops feed of driving current into the optical transmitting unit by driving current feed unit only at the time of optical output cut-off, and compensates individual different time constants at the time of change of the transmission level and reference level in transient response by optical output cut-off or its cancellation, so that either one of the transmission level or reference level may be always higher than the other within the transient response time by the optical output cut-off or its cancellation.

That is, when the optical output is cut off, feed of driving current is stopped, and either one of the transmission level or reference level is always set higher than the other by the time constant compensating unit at the time of transient response by the optical output cut-off or its cancellation, thereby compensating for the difference in change of the transmission level and reference level having mutually different time constants at the time of transient response by optical output cut-off or its cancellation.

According to this embodiment of the invention, when the optical output is cut off, feed of driving current is stopped, and either one of the transmission level or reference level is always is always set higher than the other by the time constant compensating unit at the time of transient response by the optical output cut-off or its cancellation, thereby compensating for the difference in change of the transmission level and reference level having mutually different time constants at the time of transient response by optical output cut-off or its cancellation. It is therefore possible to prevent generation of excessive optical output conventionally experienced at the time of transient response by optical output cut-off or its cancellation only by adding a simple element to the conventional optical transmitter having the APC circuit.

The invention additionally relates to an optical transmitter which comprises (a) optical transmitting unit for issuing a signal light by an output power corresponding to a supplied driving current, (b) optical receiving unit for receiving part of the output light from the optical transmitting unit, (c) transmission level detector for detecting a transmission level depending on the reception power by the optical receiving unit, (d) reference level generator for generating a reference level on the basis of a mark rate, (e) driving current changing unit for changing the driving current so that the transmission level detected by the transmission level detector may be equal to the reference level generated by the reference level generator, (f) driving current limit judging unit for judging if the driving current changed by the driving current changing unit has exceeded a predetermined driving current limit value or not, (g) driving current limit feed unit for feeding the driving current limit value into the optical transmitting unit when the changed driving current is judged to be over the predetermined driving current limit value by the driving current limit judging unit, (h) driving current feed unit for feeding the changed driving current into the optical transmitting unit when the changed driving current is not judged to be over the predetermined driving current limit value by the driving current limit judging unit, and (i) time constant compensating unit for stopping feed of driving current into the optical transmitting unit by the driving current feed unit only at the time of optical output cut-off, compensating individual different time constants at the time of change of the transmission level and reference level in transient response by optical output cut-off or its cancellation by changing the driving current limit value and transmission level.

That is, the power of the signal light issued from the optical transmitting unit is adjusted by feeding the changed driving current into the optical transmitting unit so that the transmission level detected by the transmission level detector depending on the reception power in part of the signal light issued by the optical transmitting unit may be equal to the reference level generated by the reference level generator on the basis of the mark rate of the transmission data. However, the driving current limit judging unit judges if the driving current supplied into the optical transmitting unit has exceeded the predetermined driving current limit value or not, and when the supplied driving current is judged to be over the driving current limit value, the driving current limit feed unit feeds the driving current at the driving current limit value into the optical transmitting unit, and when the driving current is not judged to be over the driving current limit value, the driving current is directly supplied into the optical transmitting unit. Hence, excessive driving current is not supplied into the optical transmitting unit. When the optical output cut off, feed of driving current into the optical transmitting unit is stopped, and the transmission level and driving current limit value are changed by the time constant compensating unit at the time of transient response by optical output cut-off or its cancellation, thereby compensating for the difference in change of the transmission level and reference level having mutually different time constants at the time of transient response by optical output cut-off or its cancellation. It is therefore possible to limit excessive optical output in usual operation, and prevent generation of excessive optical output at the time of transient response by optical output cut-off or its cancellation.

According to this embodiment of the invention, the driving current supplied into the optical transmitting unit is limited, and when the optical output is cut off, feed of driving current is stopped, and further the transmission level and driving current limit value are changed by the time constant compensating unit at the time of transient response by optical output cut-off or its cancellation, thereby compensating for the difference in change of the transmission level and reference level having mutually different time constants at the time of transient response optical output cut-off or its cancellation. It is therefore possible to limit excessive optical output in usual operation, and prevent generation of excessive optical output conventionally experienced at the time of transient response by optical output cut-off or its cancellation.

The invention also relates to an optical transmitter which further comprises driving current limit judging unit for judging if the driving current changed by the driving current changing unit has exceeded a predetermined driving current limit value or not, and driving current limit feed unit for feeding the driving current limit value into the optical transmitting unit when the changed driving current is judged to be over the predetermined driving current limit value by the driving current limit judging unit, in which the driving current feed unit feeds the changed driving current into the optical transmitting unit when the changed driving current is not judged to be over the predetermined driving current limit value by the driving current limit judging unit.

That is, the driving current limit judging unit judges if the driving current supplied into the optical transmitting unit has exceeded the predetermined driving current limit value or not, and when the supplied driving current is judged to be over the current limit value, the driving current limit feed unit feeds the driving current at the driving current limit value into the optical transmitting unit, and when the driving current is not judged to be over the current limit value, the driving current is directly supplied into the optical transmitting unit.

According to this embodiment of the invention, in addition to the effects of the invention of previous embodiments, since the driving current supplied into the optical transmitting unit is limited, the reliability of the optical transmitter is further enhanced.

BRIEF DESCRIPTION OF THE DRAWINGS

FIG. 5 is a schematic waveform diagram showing changes in transient response of optical output when average voltage V1 is larger than reference voltage V2;

FIG. 6 is a schematic waveform diagram showing changes in transient response of optical output when average voltage V1 is not larger than reference voltage V2;

DESCRIPTION OF THE PREFERRED EMBODIMENTS

Referring now to the accompanying drawings, preferred embodiments of the invention are described specifically described below.

Figure 1:
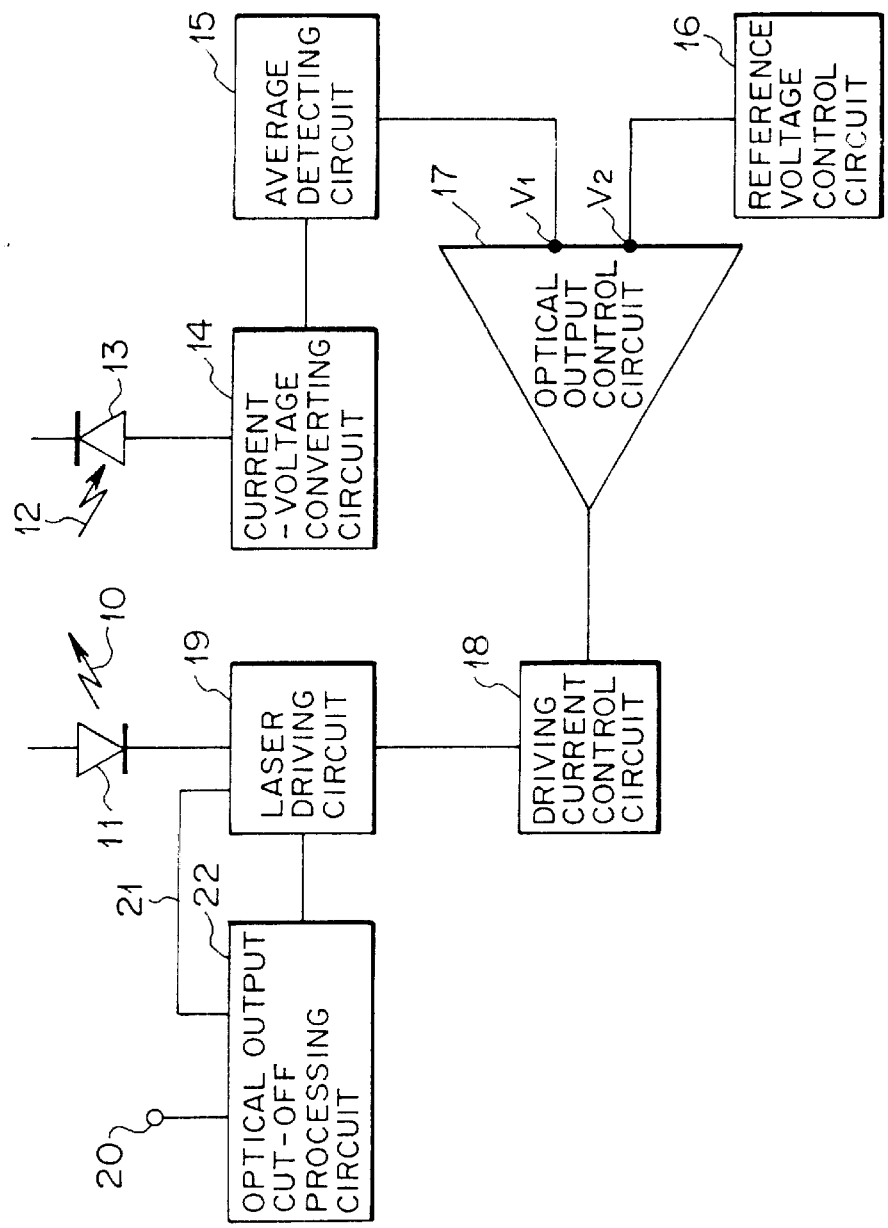
FIG. 1 is a block diagram showing an outline of a constitution of a conventionally proposed optical transmitter.
Figure 2:
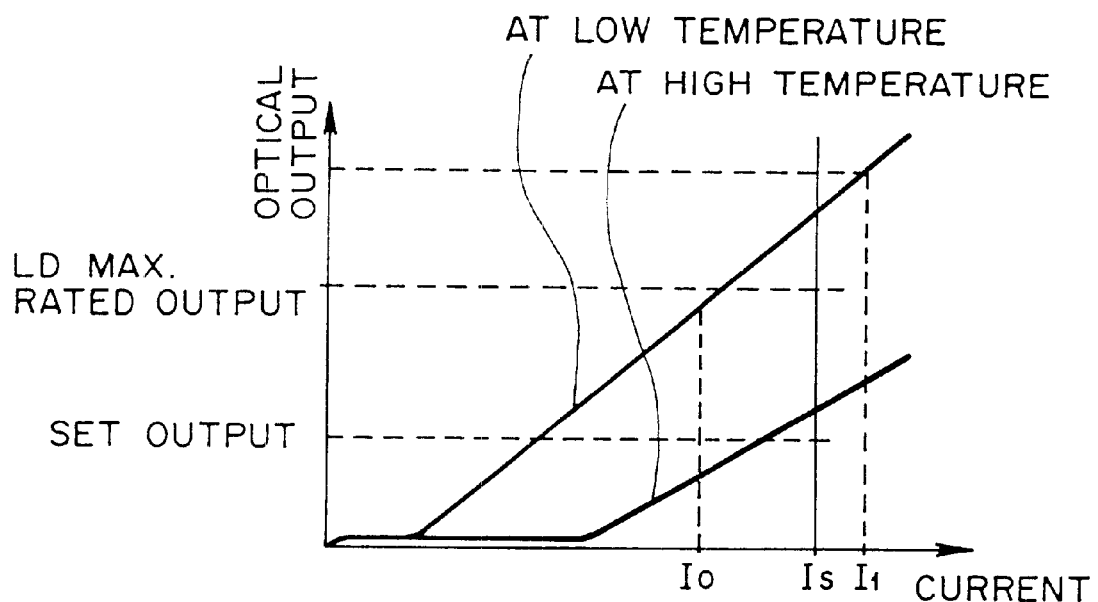
FIG. 2 is an explanatory diagram showing the relation of optical output from LD by driving current.
Figure 7:
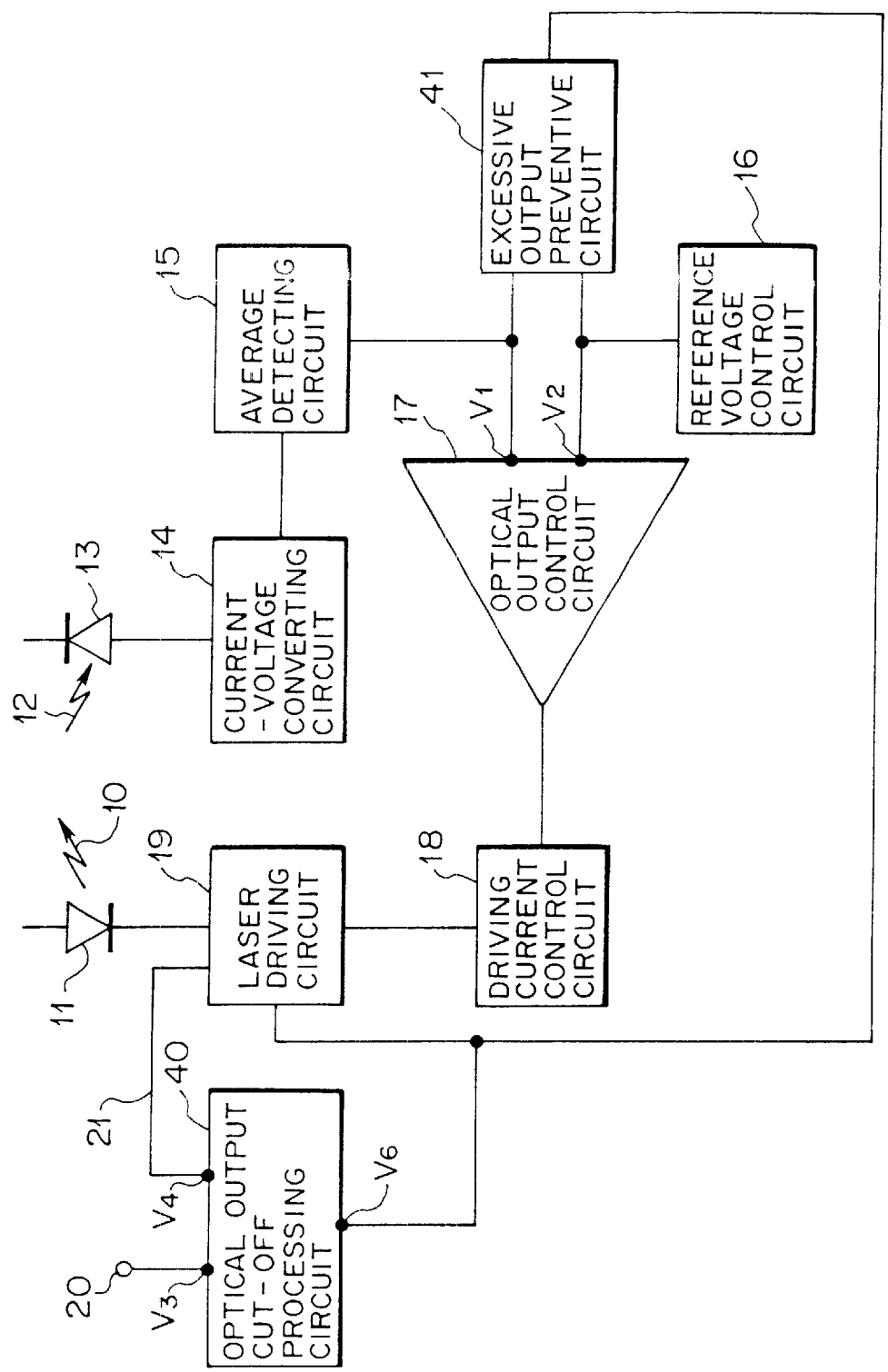
FIG. 7 a block diagram showing an outline of a constitution of an optical transmitter in a first embodiment of the invention.

FIG. 7 shows an outline of a constitution of an optical transmitter in a first embodiment of the invention. In FIG. 7, same components as in the optical transmitter in FIG. 1 are identified with same reference numerals, and the explanation is appropriately omitted. This optical transmitter comprises an LD 11 for issuing a signal line 10 depending on a driving current, and a photo diode 13 for receiving part of the output light of the LD 11 or back light 12, and converting into a current depending on the reception power. This optical transmitter further comprises a current-voltage converting circuit 14 for converting the received current generated by receiving part of the output light or back light by the photo diode 13 into a voltage value, and an average detecting circuit 15 for detecting the average of the voltage values converted by the current-voltage converting circuit 14. Herein, the average voltage detected by the average detecting circuit 15 is supposed to be V1. It further comprises a reference voltage control circuit 16 for detecting the mark rate which is the appearance ratio of "1" and "0" of transmission data, and issuing a corresponding voltage value as reference voltage V2, and the average voltage V1 and reference voltage V2 are entered in an optical output control circuit 17.

The optical output control circuit 17 issues a control signal so that the entered average voltage V1 and reference voltage V2 may be equal to each other, and its output is entered in a driving current control circuit 18. The driving current control circuit 18 controls a laser driving circuit 19 which generates a driving current of the LD 11, so that the laser driving circuit 19 may not pass a current exceeding a preset value of the LD 11. It is therefore possible to prevent the LD 11 from generating an excessive optical output power by an excessive driving current in usual operation except for the transient response time as mentioned above. The output of the driving current control circuit 18 controlled by the optical output control circuit 17 is put into the laser driving circuit 19, so that the driving current of the LD 11 can be controlled. That is, the control signal issued from the optical output control circuit 17 can control the average voltage V1 detected by the average detecting circuit 15 by changing the optical power of the optical signal.

Moreover, the optical transmitter is also characterized by comprising further an optical output cut-off processing circuit 40 for issuing an optical output cut-off control signal V5 by receiving an optical output cut-off condition detection signal 21 issued by the laser driving circuit 19 when detecting a predetermined optical output cut-off condition or an external optical output forced cut-off input 20, and an excessive output preventive circuit 41 for controlling the average voltage V1 and reference voltage V2 by the optical output cut-off processing circuit 40. When the optical output forced cut-off input 20 for cutting off the optical output by force from outside, or the optical output cut-off condition detecting signal 21 for cutting off the optical output when the mark rate is below the specified value due to cut-off of, for example, transmission data or clock is entered, the optical output cut-off processing circuit 40 issues an optical output cut-off control signal V5 to the laser driving circuit 19 and excessive output preventive circuit 41.

When the optical output cut-off control signal V5 is entered, the laser driving circuit 19 stops feed of driving current into the LD 11, and stops the optical output. When the optical output cut-off is noticed by the optical output cut-off control signal V5, the excessive output preventive circuit 41 controls the average voltage V1 and reference voltage V2 entered in the optical output control circuit 17, and suppresses generation of excessive driving current issued at the time of transient response by optical output cut-off, thereby preventing excessive optical output by the LD 11. When cancellation of optical output cut-off is noticed by the optical output cut-off control signal V5, feed of driving current into the laser driving circuit 19 is resumed, and by controlling the average voltage V1 and reference voltage V2 entered in the optical output control circuit 17, generation of excessive driving current issued at the time of transient response by cancellation of optical output cut-off is suppressed, so that excessive optical output by the LD 11 is prevented.

Figure 8:
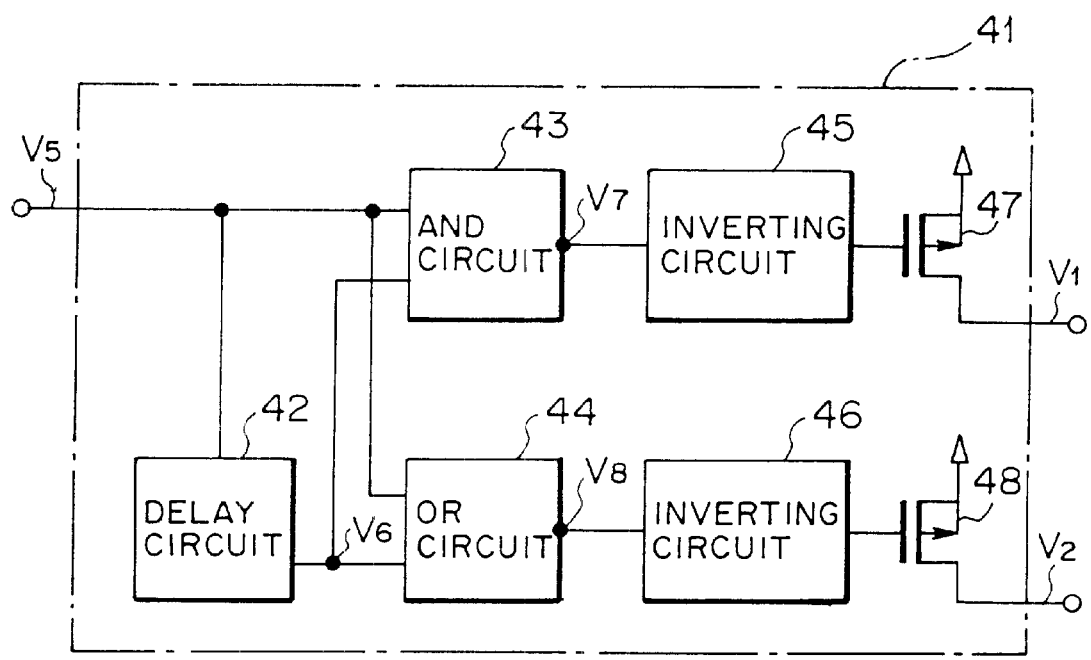
FIG. 8 is a block diagram showing an outline of a constitution of an excessive output preventive circuit in the first embodiment of the invention.

FIG. 8 shows an outline of a constitution of the excessive output preventive circuit 41 shown in FIG. 7. This excessive output preventive circuit 41 comprises a delay circuit 42, a two-input AND circuit 43, and a two-input OR circuit 44, and an optical output cut-off control signal V5 from the optical output cut-off processing circuit 40 is entered at one end of each circuit. It further comprises inverting circuits 45, 46, and p-channel MOS (metal oxide semiconductor) transistors 47, 48. At other input of the AND circuit 43, an output of the delay circuit 42 is connected. At other input of the OR circuit 44, an output of the delay circuit 42 is connected. The output of the AND circuit 43 is connected to a gate terminal of the p-channel MOS transistor 47 through an inverting circuit 45 for inverting the logic. The output of the OR circuit 44 is connected to a gate terminal of the p-channel MOS transistor 48 through an inverting circuit 46 for inverting the logic. The p-channel MOS transistor 47 has its source terminal connected to the supply voltage, and drain terminal to the average voltage V1, respectively. The p-channel MOS transistor 48 has its source terminal connected to the supply voltage, and drain terminal to the reference voltage V2, respectively.

Therefore, when the output of the inverting circuit 45 is in "L" level state, the p-channel MOS transistor 47 is turned on, and the average voltage V1 entered in the optical output control circuit 17 is at supply voltage level. On the other hand, when the output of the inverting circuit 45 is in "H" level state, the p-channel MOS transistor 47 is turned off, and the average voltage V1 entered in the optical output control circuit 17 is the average voltage value detected by the average detecting circuit 15. When the output of the inverting circuit 46 is in "L" level state, the p-channel MOS transistor 48 is turned on, and the reference voltage V2 entered in the optical output control circuit 17 is at supply voltage level. On the other hand, when the output of the inverting circuit 46 is in "H" level state, the p-channel MOS transistor 48 is turned off, and the reference voltage V2 entered in the optical output control circuit 17 is the reference voltage value depending on the mark rate detected by the reference voltage control circuit 16.

Figure 9:
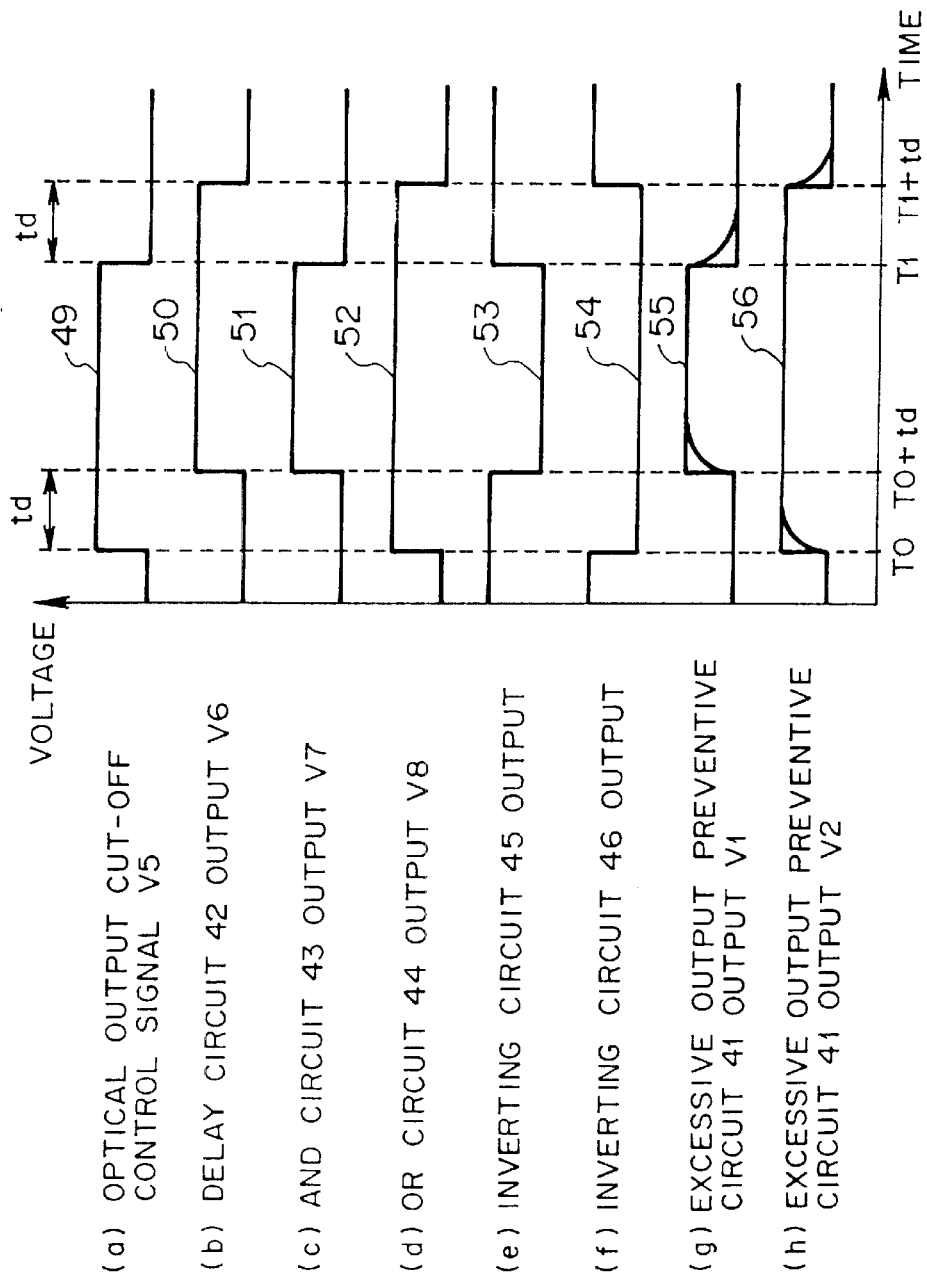
FIG. 9 is a timing chart showing an outline of operation of excessive output preventive circuit 41 in the first embodiment of the invention.

FIG. 9 shows an outline of operation of the excessive output preventive circuit 41 shown in FIG. 8. However, the delay time generated by the delay circuit 42 is supposed to be td, the output voltage of the delay circuit 42 to be V6, the output voltage of the AND circuit 43 to be V7, and the output voltage of the OR circuit 44 to be V8. The optical output cut-off control signal V5 is supposed to come in "H" level state at time T0, and "L" level state at time T1 (FIG. 9(a) 49). The output V6 of the delay circuit 42 comes in "H" level state at time T0+td in delay time of td, and in "L" level state at time T1+td (FIG. 9(b) 50). The output V7 of the AND circuit 43 comes in "H" level state when both optical output cut-off control signal V5 and output V6 of the delay circuit 42 are in "H" level state (FIG. 9(c) 51). The output V8 of the OR circuit 44 comes in "H" level state when both optical output cut-off control signal V5 and output V6 of the delay circuit 42 are in "H" level state (FIG. 9(d) 52). The output of the inverting circuit 45 is an inversion of the output V7 of the AND circuit 43 (FIG. 9(e) 53). The output of the inverting circuit 46 is an inversion of the output V8 of the OR circuit 44 (FIG. 9(f) 54).

Therefore, the output V1 of the excessive output preventive circuit 41 delivers the supply voltage level from time T0+td to time T1, so that the average voltage V1 is the supply voltage level from time T0+td to time T1, and otherwise it is the average voltage detected by the average detecting circuit 15. Likewise, the output V2 of the excessive output preventive circuit 42 delivers the supply voltage level from time T0 to time T1+td, so that the reference voltage V2 is the supply voltage level from time T0 to time T1+td, and otherwise it is the reference voltage depending on the mark rate detected by the reference voltage control circuit 16. However, both average voltage V1 and reference voltage V2 are changed gradually by mutually different time constants (FIG. 9(g) 55, FIG. 9(h) 56).

In thus constitution optical transmitter of the embodiment, the operation is described below.

Figure 10:
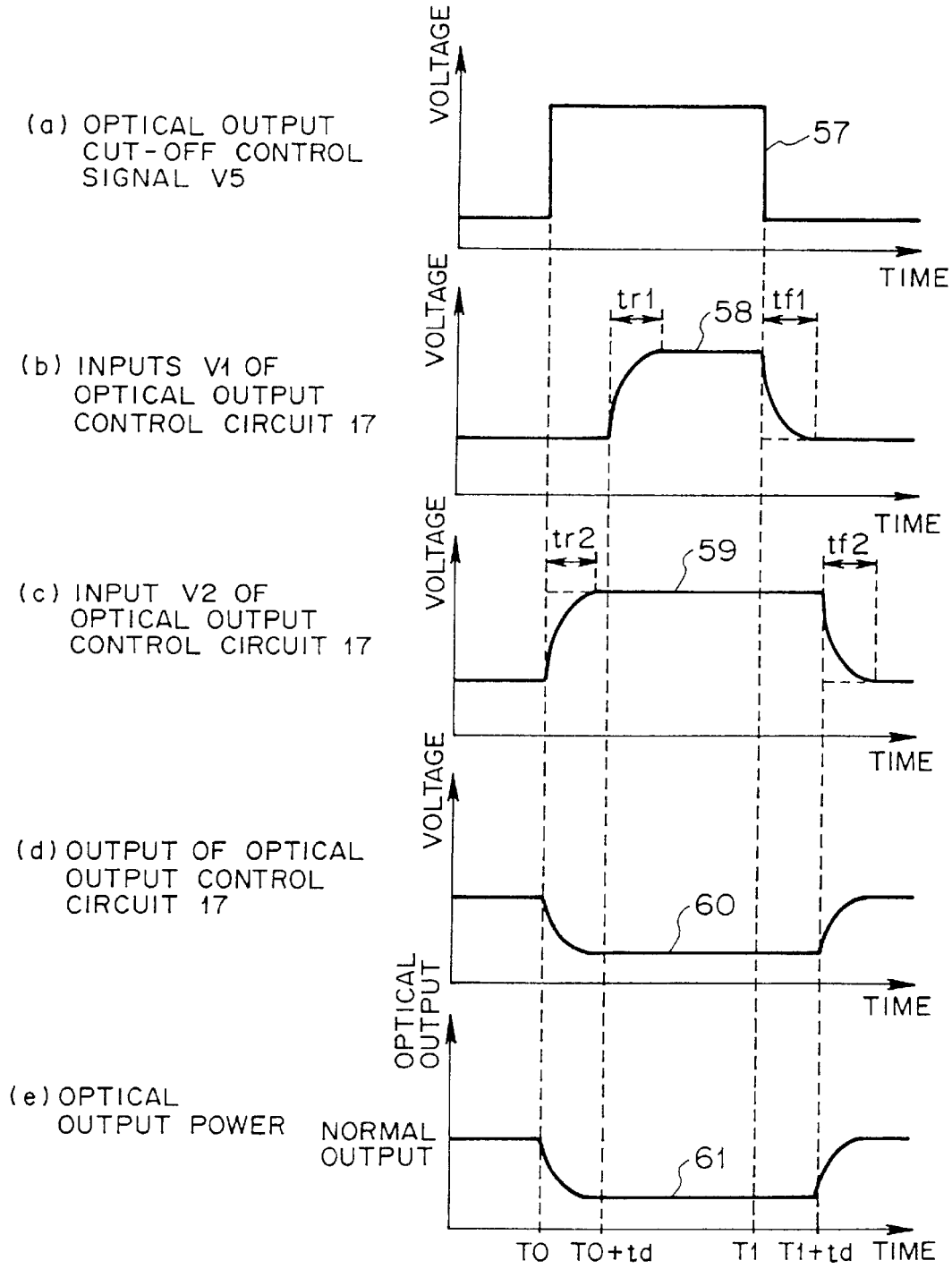
FIG. 10 is a schematic waveform diagram showing an outline of operation of the optical transmitter in the first embodiment of the invention.

FIG. 10 shows an outline of operation of the optical transmitter shown in FIG. 7 to FIG. 9. As shown in FIG. 10(a), when the optical output cut-off control signal V5 comes in "H" level state at time T0 (FIG. 10(a) 57), the output V1 of the excessive voltage preventive circuit 41 becomes a supply voltage level after the output V7 of the AND circuit 43 has turned on the p-channel transistor 47 in delay time td by the delay circuit 42 as shown in FIG. 9 (FIG. 10(b) 58). On the other hand, the output V2 of the excessive output preventive circuit 41 becomes a supply voltage level after the output V8 of the OR circuit 44 is turned on to turn on the p-channel MOS transistor 46 as shown in FIG. 9 (FIG. 10(b) 59). As a result, from time T0 to T0+td, the relation of V1<V2 is always maintained, and the output of the optical output control circuit 17 begins to decrease gradually from time T0 (FIG. 10(d) 60), and the optical output stops finally (FIG. 10(e) 61).

Figure 3:
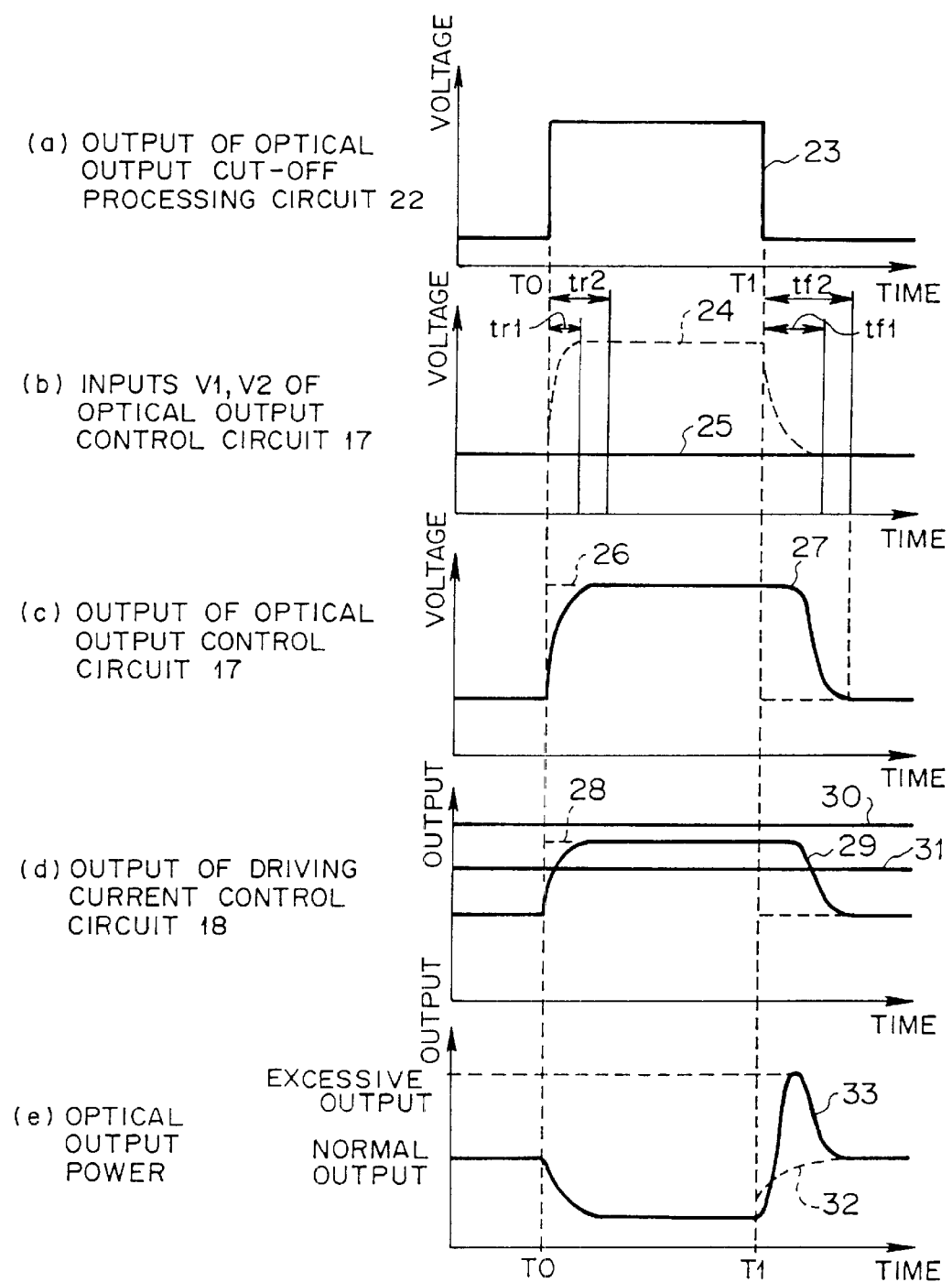
FIG. 3 is a timing chart showing an outline of operation of a conventional optical transmitter.
Figure 4:
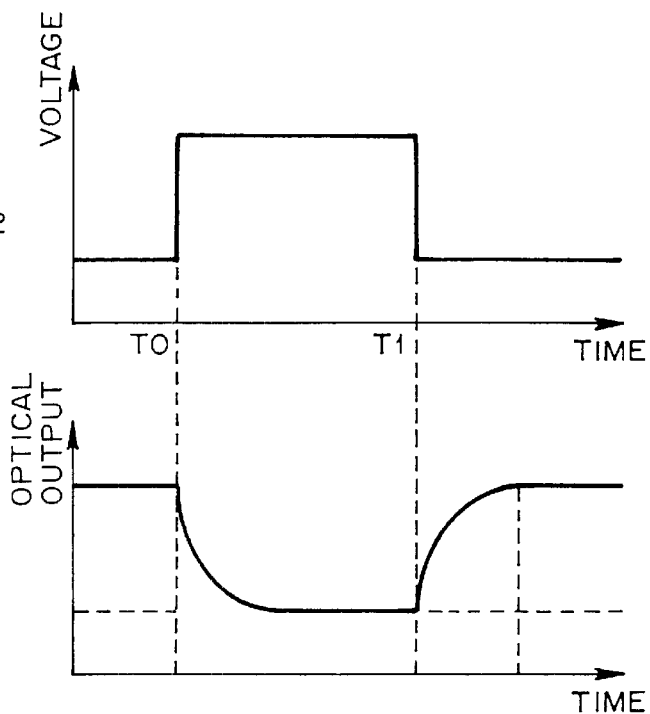
FIG. 4 is a schematic waveform diagram showing changes in transient response of optical output when average voltage V1 and reference voltage V2 change similarly because an average detecting circuit and a reference voltage control circuit have same time constants.

When the optical output cut-off control signal V5 comes in "L" level state at time T1 (FIG. 10(a)), the output V1 of the excessive voltage preventive circuit 41 changes from the supply voltage level to the average voltage issued by the average detecting circuit 15 because the output V7 of the AND circuit 43 shown in FIG. 3 becomes "L" level to turn off the p-channel MOS transistor 47 (FIG. 10(b) 58). On the other hand, the output V2 of the excessive output preventive circuit 41 remains at the supply voltage level, and from time T1 to T1+td, the relation of V1<V2 is always maintained. However, at time T1+td, since the output V8 of the OR circuit 44 becomes "L" level, the p-channel MOS transistor 48 is turned off, and the output V2 changes from the supply voltage level to the reference voltage issued by the reference voltage control circuit 16 (FIG. 10(d) 59). Accordingly, the output of the optical output control circuit 17 begins to increase, and the optical output power becomes gradually larger (FIG. 10(d) 60, FIG. 10(e) 61).

As explained herein, according to the optical transmitter of the first embodiment of the invention, by using the delay time td by the delay circuit 42 of the excessive output preventive circuit 41, generation of excessive optical output is prevented by controlling to maintain the relation of V1<V2 all the time between the average voltage V1 and reference voltage V2 at the time of transient response by optical output cut-off and cancellation of optical output cut-off.

A second embodiment of the invention is described below. In the optical transmitter of the first embodiment, the relation of V1<V2 is maintained by delaying in the delay time for covering the response time by optical output cut-off and cancellation of optical output cut-off in the delay circuit 42 of the excessive output preventive circuit 31. It was, however, required to select a proper delay time and create it in the delay circuit. On the other hand, in the optical transmitter of the second embodiment, the excessive output preventive circuit 41 is composed so as to present V1 and V2 to keep the relation of V1<V2 always at the time of optical output cut-off. Therefore, as compared with the constitution of the optical transmitter in the first embodiment, the essential structure of the optical transmitter is same as in FIG. 1, but the constitution of the excessive output preventive circuit 41 is different.

Figure 11:
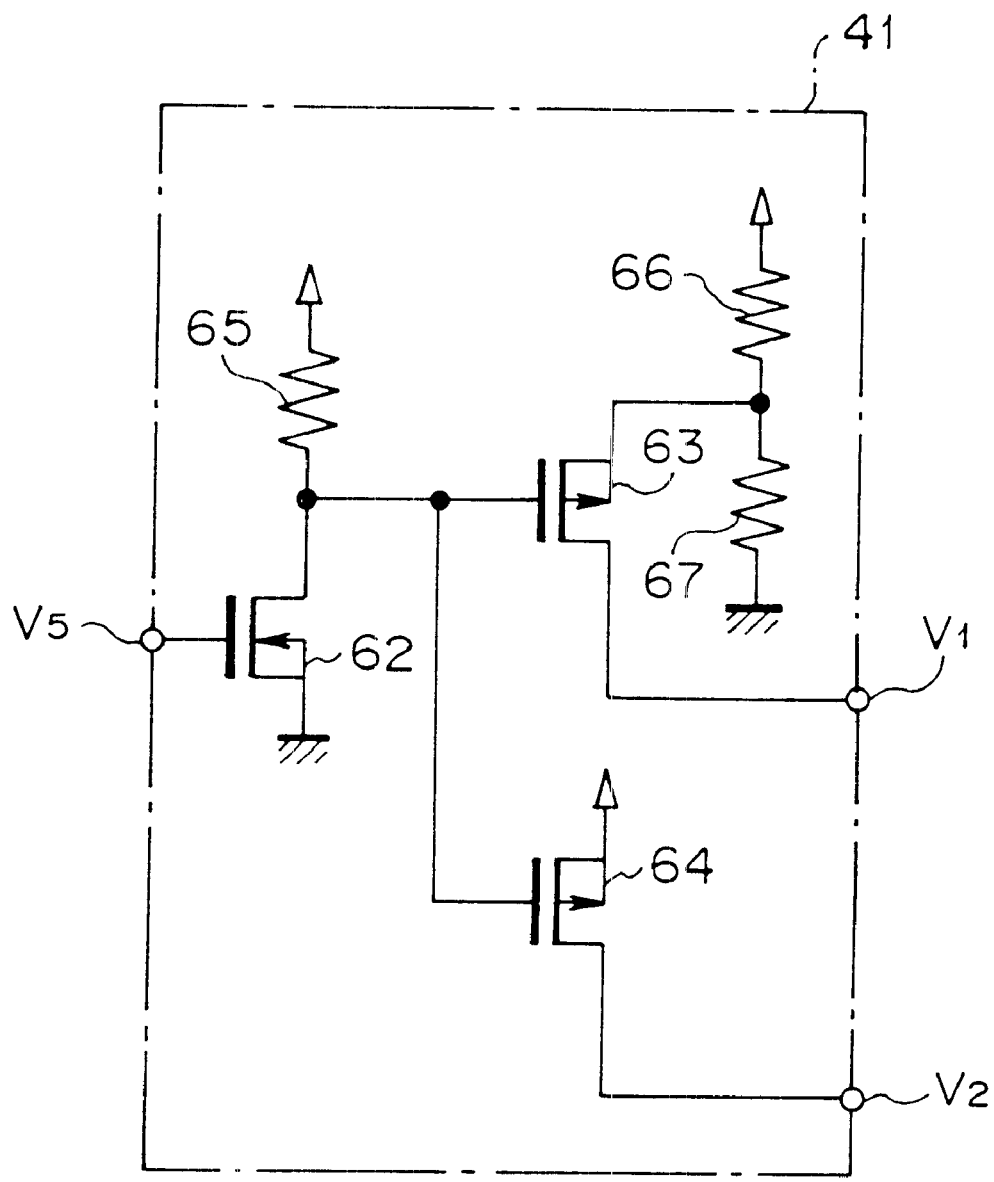
FIG. 11 is a structural diagram showing an outline of a constitution of an excessive output preventive circuit in a second embodiment of the invention.

FIG. 11 shows an outline of a constitution of the excessive output preventive circuit 41 in the second embodiment. This excessive output preventive circuit 41 comprises n-channel MOS transistor 62, and p-channel MOS transistors 63, 64. The optical output cut-off control signal V5 is connected to a gate terminal of the n-channel MOS transistor 62. The ground is connected to a source terminal of the n-channel MOS transistor 62, and a supply voltage level is connected to its drain terminal through a resistance 65. Moreover, the drain terminal of the n-channel MOS transistor 62 is connected to the gate terminal of the p-channel MOS transistor 63 and the gate terminal of the p-channel MOS transistor 64. Further, the source terminal of the p-channel MOS transistor 63 is connected to the connection point of resistances 66, 67 so as to supply a voltage level V9 having the supply voltage divided by the resistances 66, 67, and the drain terminal is issued as output V1. The source terminal of the p-channel MOS transistor 64 is connected to the supply voltage level, and the drain terminal is issued as output V2.

In the excessive output preventive circuit 41, when the input V5 becomes "H" level state, the n-channel MOS transistor 62 is turned on, and the gate terminals of the p-channel MOS transistors 63, 64 are provided with "L" levels, and the both p-channel MOS transistors 63, 64 are turned on. As a result, at the output V1, and voltage level V9 in which the supply voltage level is divided by the resistances 66, 67 is issued, and the supply voltage level is issued to the output V2. When the input V5 becomes "L" level state, the n-channel MOS transistor 62 is turned off, and the average voltage issued from the average detecting circuit 15 is given to V1, and the reference voltage issued from the reference voltage control circuit 16 is given to V2.

Figure 12:
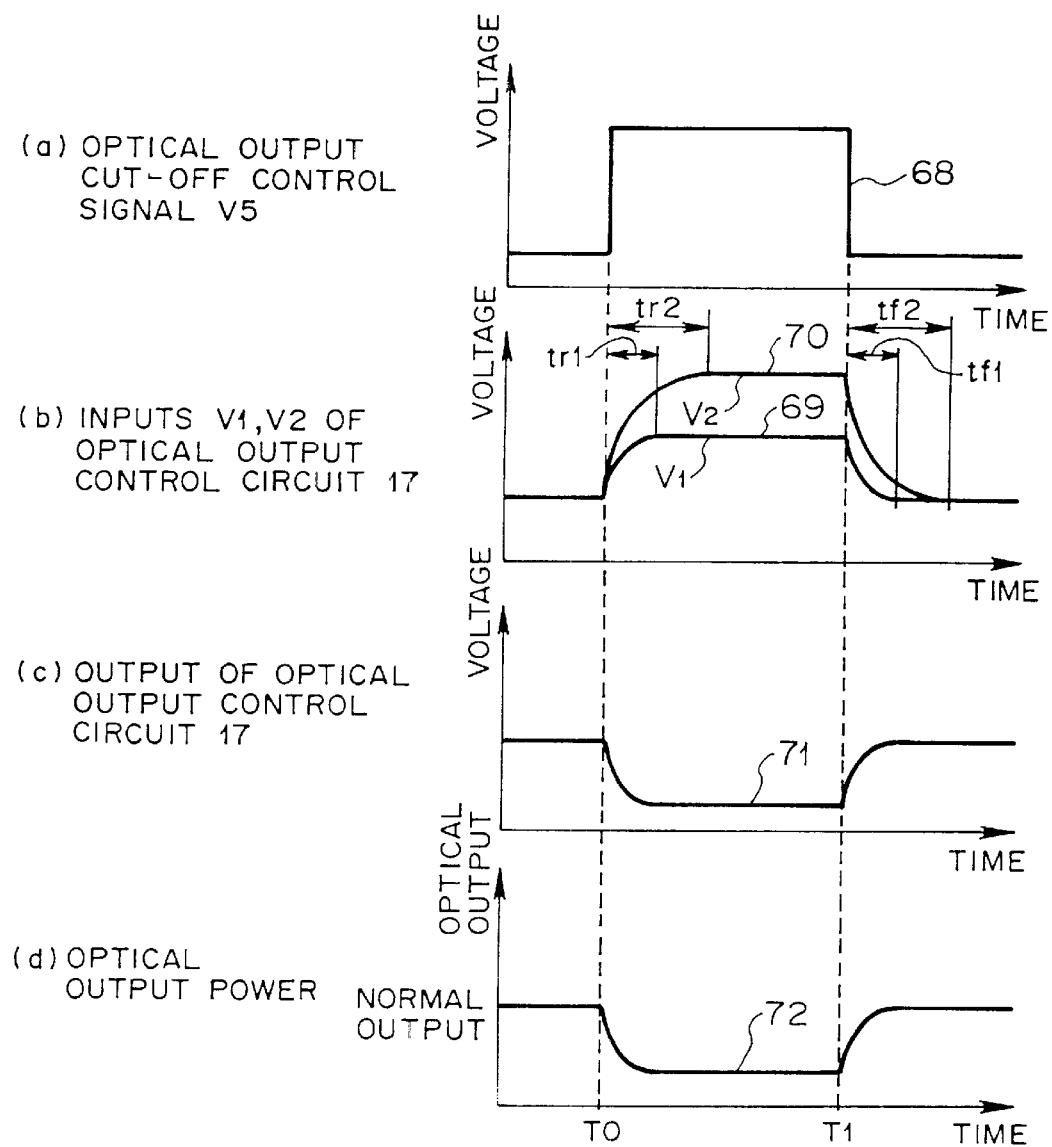
FIG. 12 is a schematic waveform diagram showing an outline of operation of the optical transmitter in the second embodiment of the invention.

FIG. 12 shows an outline of operation of such optical transmitter of the second embodiment. When the optical output cut-off control signal V5 becomes "H" level state at time T0 (FIG. 12(a) 68), as mentioned above, the n-channel MOS transistor 62 shown in FIG. 5 is turned on, and V1 and V2 become divided voltage level V9 and supply voltage level, respectively. At this time, they change slowly in the duration of tr1, tr2 by each time constant (FIG. 12(b) 69, 70). Even in such transient response time by optical output cut-off, since the relation of V1<V2 is maintained all the time, so that excessive optical output does not occur.

At time T1, when the optical output control signal V5 becomes L level state (FIG. 12(a) 68), by setting V9 properly to keep the relation of tf1<tf2, the relation of V1<V2 can be also maintained at the time of transient response by cancellation of optical output cut-off, so that the optical output increases gradually without generating excessive optical output.

Incidentally, the value of V9 must be determined in consideration of tr1, tr2, tr1, tr2 at the time of transient response by optical output cut-off and cancellation of optical output cut-off so as to maintain the relation of V1<V2 all the time. If the V9 is too low, it may result in V1>V2 due to relaxation oscillation, and therefore the upper limit and the lower limit are always present in setting of V9.

A third embodiment of the invention is described below. In the optical transmitter of the third embodiment, the reference of driving current control circuit is changed at the time of optical output and optical output cut-off, and further by controlling the input V1 of the optical output control circuit, it is intended to prevent generation of excessive optical output at the time of transient response.

Figure 13:
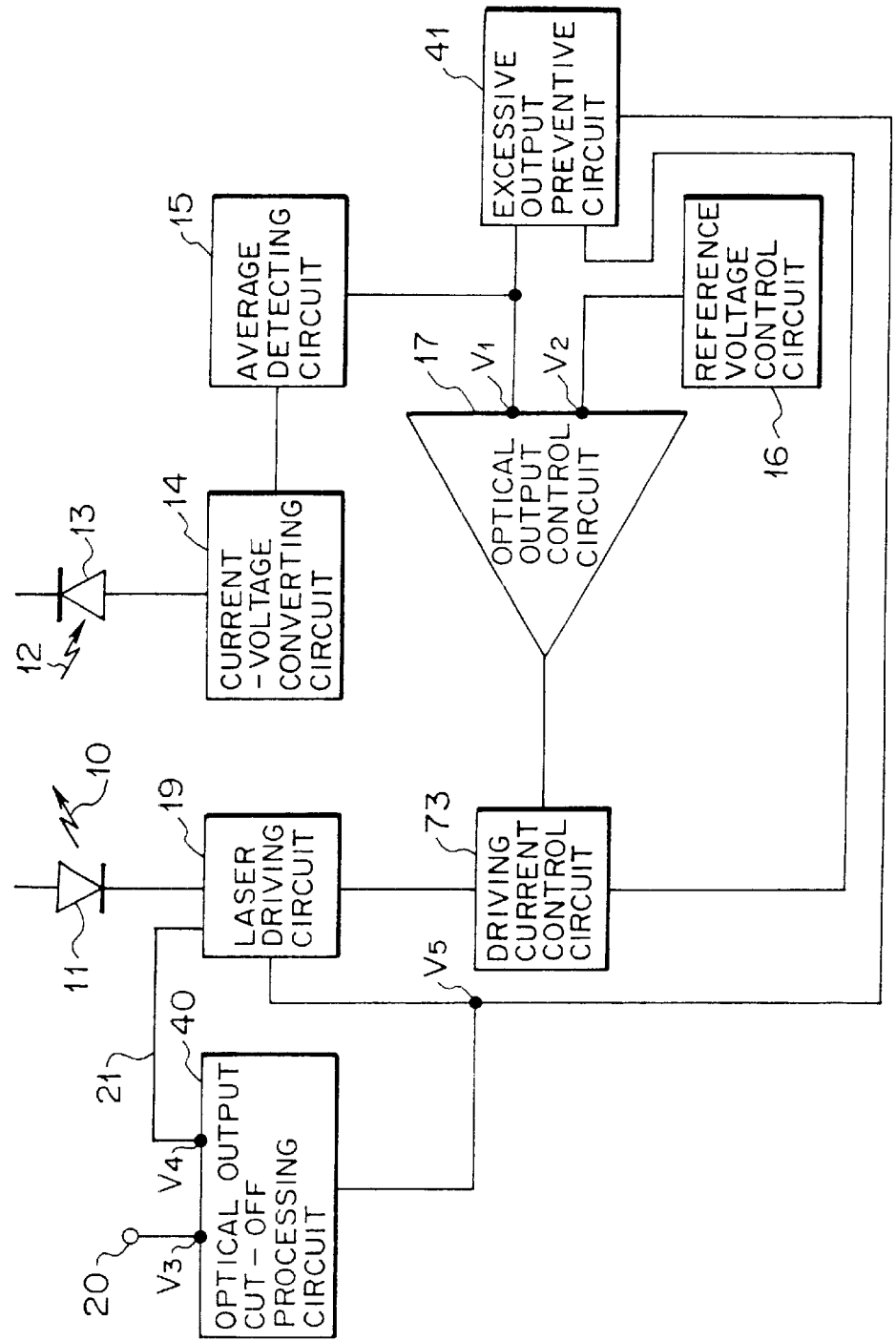
FIG. 13 is a block diagram showing an outline of a constitution of an optical transmitter in a third embodiment of the invention.

FIG. 13 shows an outline of a constitution of the optical transmitter in the third embodiment of the invention. Same components as in the constitution of the optical transmitter of the first embodiment in FIG. 7 are identified with same reference numerals, and explanations are appropriately omitted. What the optical transmitter of the third embodiment differs from the optical transmitter of the first embodiment is that the output from the p-channel MOS transistor 48 for receiving inversion of the OR circuit 44 of the excessive output preventive circuit 41 is entered in the driving current control circuit. Therefore, the constitution of the driving current control circuit is also different.

That is, the optical output cut-off control signal V5 which is the output of the optical output cut-off processing circuit 40 is connected to the laser driving circuit 19 and excessive output preventive circuit 41, and the output of the excessive output preventive circuit 41 is connected to the average voltage V1 of the optical output control circuit 17, while the other is connected to a driving current control circuit 73. At this time, the drain terminal of the p-channel MOS transistor 47 for receiving the output of the AND circuit 43 is connected to the average voltage V1 issued by the average detecting circuit 15, and the drain terminal of the p-channel MOS transistor 48 for receiving the output of the OR circuit 44 is connected to the driving current control circuit 73. It is therefore intended to change the driving current limit set value limited by the driving current control circuit 73 at the time of optical output cut-off.

Figure 14:
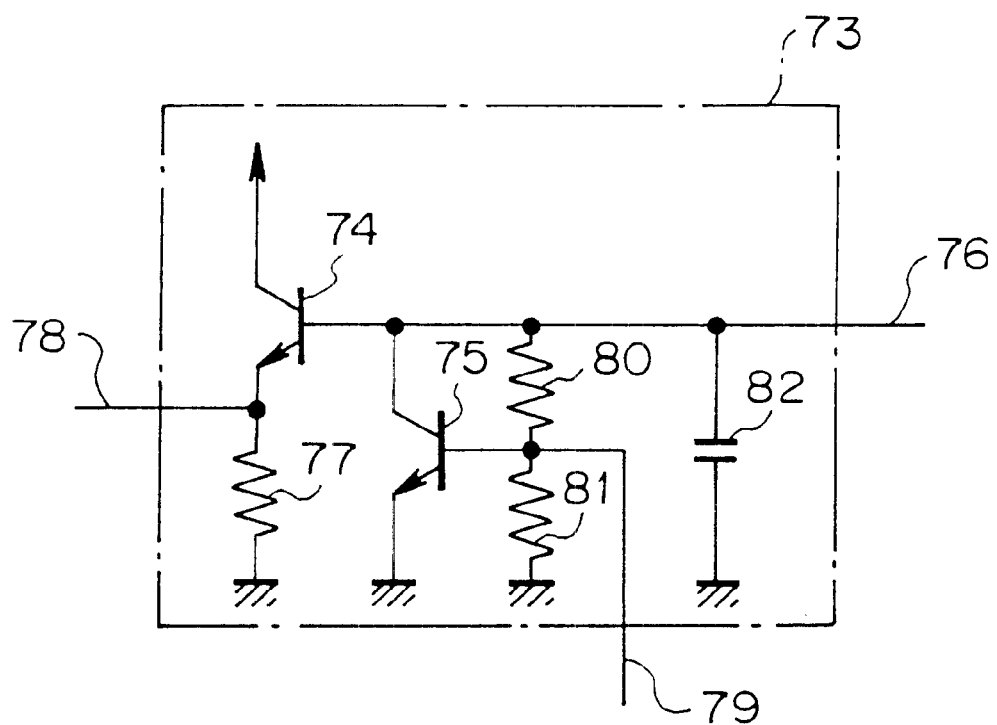
FIG. 14 is a structural diagram showing an outline of a constitution of a driving current control circuit in the third embodiment of the invention.

FIG. 14 shows an outline of a constitution of the driving current control circuit 73 in the third embodiment. This driving current limit circuit 73 comprises pnp bipolar transistors 74, 75. An input 76 from the optical output control circuit 17 is connected to a base terminal of the pnp bipolar transistor 74 and a collector terminal of the pnp bipolar transistor 75. The collector terminal of the pnp bipolar transistor 74 is connected to the power source, and the emitter terminal is connected to the ground through a resistance 77, and directly becomes an output 78 to the laser driving circuit 19. The base terminal of the pnp bipolar transistor 75 is connected to an input 79 from the excessive output preventive circuit 41, and the emitter terminal is connected to the ground and is grounded. The input 79 from the excessive output preventive circuit 41 is connected to a resistance 80 to connect with the input 76 from the optical output control circuit 17 and a resistance 81 to connect with the ground. A capacitor 82 is connected between the input 76 from the optical output control circuit 17 and the ground.

In thus constituted driving current control circuit 73, when the input 71 from the excessive output preventive circuit 41 is in "L" level state, the pnp bipolar transistor 75 remains off, and therefore the laser driving circuit 19 is directly controlled depending on the input 76 from the optical output control signal 17. On the other hand, when the input 71 from the excessive output preventive circuit 41 is in "H" level state, the pnp bipolar transistor 75 is turned on, and regardless of the input from the optical output control circuit 17, the pnp bipolar transistor 74 is turned off, and the driving current of the laser driving circuit 19 is stopped.

Figure 15:
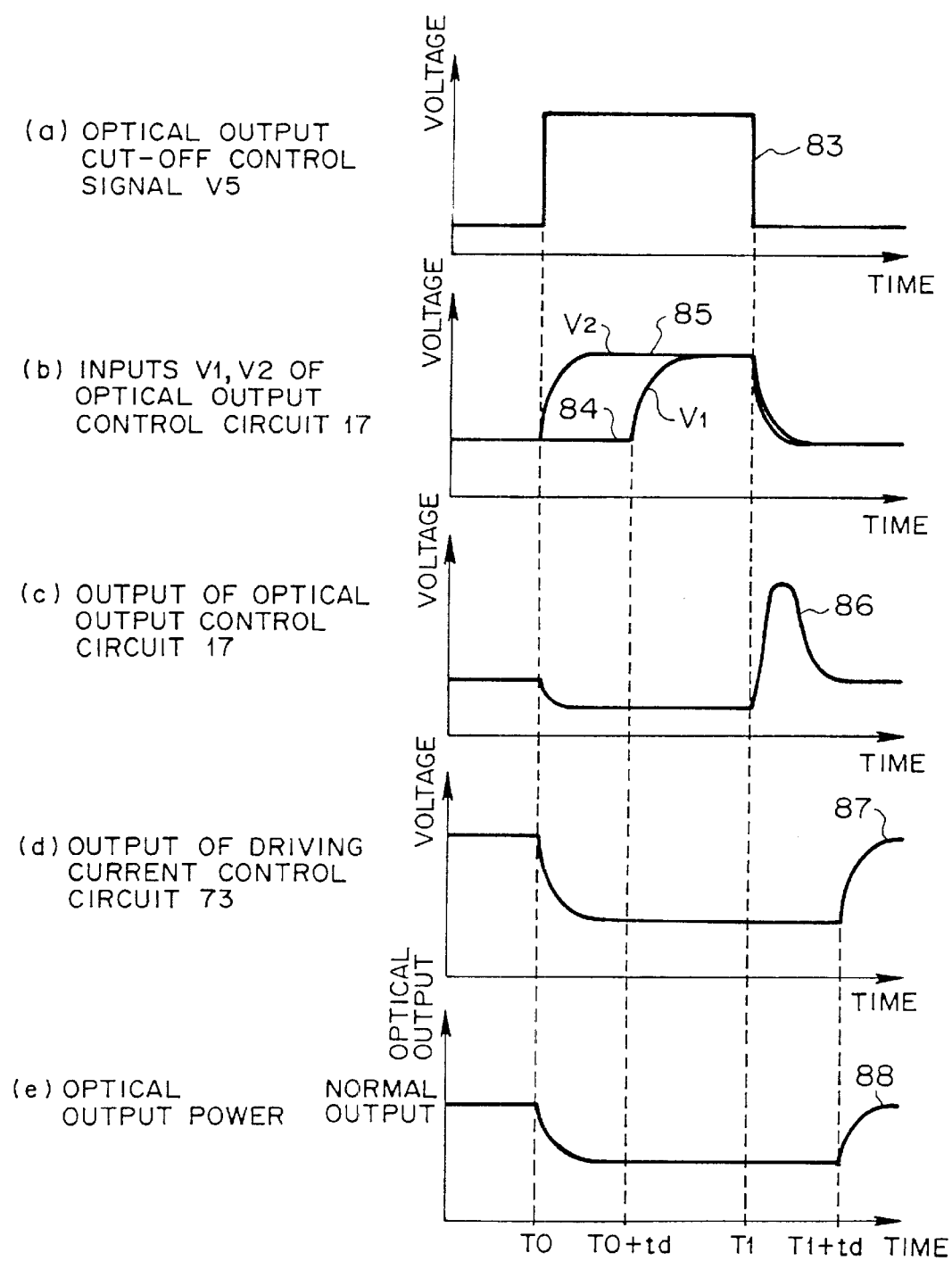
FIG. 15 is a schematic waveform diagram showing an outline of operation of the optical transmitter in the third embodiment of the invention.

FIG. 15 shows an outline of operation of the optical transmitter of the third embodiment. At time T0, when the optical output cut-off control signal V5 becomes "H" level state (FIG. 15(a) 83), the output V1 of the excessive output preventive circuit 41 becomes the supply voltage level after the output V7 of the AND circuit 43 turns on the p-channel MOS transistor 47 in delay time td by the delay circuit 42 as shown in FIG. 3 (FIG. 15(b) 84). On the other hand, the reference voltage V2 is directly entered in the input of the optical output control circuit 17 (FIG. 15(b) 85). At time T1, when the optical output cut-off control signal V5 becomes "L" level state (FIG. 15(a) 83), the output V1 of the excessive output preventive circuit 41 turns off the p-channel MOS transistor 47 as the output V7 of the AND circuit 43 becomes "L" level as shown in FIG. 3, so that the output V1 changes from the supply voltage level to the average voltage issued by the average detecting circuit 15 (FIG. 15(b) 84).

After time T1, depending on the reference voltage V2, a situation of V1>V2 may occur as the case may be, and it is controlled so that the optical output control signal may generate an excessive output (FIG. 15(c) 86). However, in the driving current control circuit 73, since the drain terminal of the p-channel MOS transistor 48 for receiving the output of the OR circuit 44 of the excessive output preventive circuit 41 is connected, the pnp bipolar transistor 74 may be kept off until time T1+td, so that excessive optical output can be suppressed (FIG. 15(d) 87). As a result, the optical output power remains at "0" (FIG. 15(e) 88). After time T1+td, along with the output changes of the driving current control circuit 73, the optical output gradually increases, and a specified output is issued without generating excessive optical output.

The first to third embodiments are explained by using the output V1 of the average detecting circuit for detecting the average of voltage values having the input voltages in the optical output control circuit converted by the current-voltage converting circuit, but the APC circuit may be also composed so that the output voltage using the peak detecting circuit or average detecting circuit and peak detecting circuit into the optical output control circuit.

In the first to third embodiments, the optical output cut-off control signal V5 is in "H" level state when the optical output is cut off, and in "L" level state when canceling the optical output cut-off, but the logic level may be inverted. In this case, the optical transmitter may be composed simply.

Also in the first to third embodiments, the delay time of the delay circuit is enough so far as excessive optical output may not be generated, but when the delay time is longer, it takes a longer time in restoration when canceling the optical output cut-off, and therefore an optimum optical transmitter may be constituted by determining in consideration of these two points.

What is claimed is:

1. An optical transmitter comprising:
an optical transmitting unit that outputs a signal light;
an optical receiving unit that receives part of the signal light output from the optical transmitting unit;
a transmission level detector that detects a transmission level of the signal light received by the optical receiving unit;
a reference level generator that generates a reference level on the basis of a mark rate of transmission data;
a driving current changing unit that changes a driving current for the optical transmitting unit so that the transmission level detected by the transmission level detector is substantially equal to the reference level generated by the reference level generator;

a driving current feed unit that drives the optical transmitting unit by feeding the driving current changed by the driving current changing unit into the optical transmitting unit; and a time constant compensating unit that stops the feed of the driving current into the optical transmitting unit by the driving current feed unit upon receipt of an optical output cut-off signal, and compensates for individual different time constants at the time of a change of the transmission level and the reference level in a transient response time after receipt of the optical output cut-off signal by changing the transmission level and the reference level.

2. The optical transmitter according to claim 1, wherein the time constant compensating unit includes a delay unit that stops the feed of the driving current into the optical transmitting unit by the driving current feed unit upon receipt of the optical output cut-off signal, and delays by the duration of a first time longer than the transient response time to the optical output cut-off signal, and compensates for the individual different time constants at the time of the change of the transmission level and the reference level in the transient response time after receipt of the optical output cut-off signal for the duration of the first time by changing the transmission level and the reference level.

3. The optical transmitter according to claim 2, further comprising:

a driving current limit judging unit that determines if the driving current changed by the driving current changing unit has exceeded a predetermined driving current lime value; and a driving current limit feed unit that feeds the driving current limit value into the optical transmitting unit when the changed driving current is over the predetermined driving current limit value, wherein the driving current feed unit feeds the changed driving current into the optical transmitting unit when the changed driving current is not over the predetermined driving current limit value.

4. The optical transmitter according to claim 1, wherein the time constant compensating unit stops the feed of the driving current into the optical transmitting unit by the driving current feed unit upon receipt of the optical output cut-off signal, and compensates for the individual different time constants at the time of the change of the transmission level and the reference level in the transient response time after receipt of the optical output cut-off signal so that either one of the transmission level and the reference level is always higher than the other within the transient response time to the optical output cut-off signal.

5. The optical transmitter according to claim 4, further comprising:

a driving current limit judging unit that determines if the driving current changed by the driving current changing unit has exceeded a predetermined driving current lime value; and a driving current limit feed unit that feeds the driving current limit value into the optical transmitting unit when the changed driving current is over the predetermined driving current limit value, wherein the driving current feed unit feeds the changed driving current into the optical transmitting unit when the changed driving current is not over the predetermined driving current limit value.

6. The optical transmitter according to claim 1, further comprising:

a driving current limit judging unit that determines if the driving current changed by the driving current changing unit has exceeded a predetermined driving current lime value; and a driving current limit feed unit that feeds the driving current limit value into the optical transmitting unit when the changed driving current is over the predetermined driving current limit value, wherein the driving current feed unit feeds the changed driving current into the optical transmitting unit when the changed driving current is not over the predetermined driving current limit value.

7. An optical transmitter comprising:

an optical transmitting unit that outputs a signal light having an output power corresponding to a supplied driving current;

an optical receiving unit that receives part of the output signal light from the optical transmitting unit;

a transmission level detector that detects a transmission level of the signal light received by the optical receiving unit;

a reference level generator for generating a reference level on the basis of a mark rate;

a driving current changing unit that changes the driving current so that the transmission level detected by the transmission level detector is substantially equal to the reference level generated by the reference level generator;

a driving current limit judging unit that determines if the, driving current changed by the driving current changing unit has exceeded a predetermined driving current limit value;

a driving current limit feed unit that feeds the driving current limit value into the optical transmitting unit when the changed driving current is over the predetermined driving current limit value;

a driving current feed unit that feeds the changed driving current into the optical transmitting unit when the changed driving current is not over the predetermined driving current limit value; and a time constant compensating unit that stops the feed of the driving current into the optical transmitting unit by the driving current feed unit upon receipt of an optical output cut-off signal, and compensates for individual different time constants at the time of a change of the transmission level and the reference level in a transient response time after receipt of the optical output cut-off signal by changing the driving current limit value and the transmission level.

8. An optical transmitter comprising:

an optical transmitting unit that outputs a signal light;

an optical receiving unit that receives part of the signal light output from the optical transmitting unit;

a transmission level circuit that converts a transmission level of the signal light received by the optical receiving unit into an average voltage;

a reference voltage control circuit that outputs a reference voltage;

a driving current control circuit that provides a driving current to the optical transmitting unit and changes the driving current such that the average voltage is substantially equal to the reference voltage; and an excessive output preventive circuit that prevents an increase in the driving current provided to the optical transmitting unit during a period of transient response between an optical output cut-off signal and termination of output of the signal light from the optical transmitting unit by controlling a relationship between the reference voltage and the average voltage.

9. The optical transmitter according to claim 8, wherein the excessive output preventive circuit controls the reference voltage and the average voltage such that the average voltage is less than the reference voltage during the period of transient response.

10. The optical transmitter according to claim 8, wherein the driving current control circuit further determines if the changed driving current has exceeded a predetermined driving current limit, provides the predetermined driving current limit to the optical transmitter unit if the changed driving current has exceeded the predetermined driving current limit and provides the changed driving current to the optical transmitter if the changed driving current does not exceed the predetermined driving current limit.

11. The optical transmitter according to claim 10, wherein the excessive output preventive circuit controls the reference voltage and the average voltage such that the average voltage is less than the reference voltage during the period of transient response.

* * * * *